United States Patent
Yang et al.

(10) Patent No.: US 12,249,496 B2
(45) Date of Patent: Mar. 11, 2025

(54) SEMICONDUCTOR PROCESSING APPARATUS AND MAGNETRON MECHANISM

(71) Applicant: BEIJING NAURA MICROELECTRONICS EQUIPMENT CO., LTD., Beijing (CN)

(72) Inventors: Yujie Yang, Beijing (CN); Xiaoyan Wang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 80 days.

(21) Appl. No.: 17/921,088

(22) PCT Filed: Apr. 16, 2021

(86) PCT No.: PCT/CN2021/087780
§ 371 (c)(1),
(2) Date: Oct. 24, 2022

(87) PCT Pub. No.: WO2021/213273
PCT Pub. Date: Oct. 28, 2021

(65) Prior Publication Data
US 2023/0170196 A1    Jun. 1, 2023

(30) Foreign Application Priority Data
Apr. 24, 2020   (CN) .......................... 202010331542.2

(51) Int. Cl.
*C23C 14/35* (2006.01)
*H01J 37/34* (2006.01)

(52) U.S. Cl.
CPC .......... *H01J 37/3408* (2013.01); *C23C 14/35* (2013.01); *H01J 37/3455* (2013.01)

(58) Field of Classification Search
CPC ............... H01J 37/3408; H01J 37/3455; H01J 37/3452; H01J 37/3497; H01J 37/3405; C23C 14/35; H01L 21/67011
(Continued)

(56) References Cited

U.S. PATENT DOCUMENTS 5,514,257 A * 5/1996 Kobayashi ............ C23C 14/165
204/192.15
6,689,254 B1 * 2/2004 Hurwitt ............... H01J 37/3497
204/298.18
(Continued)

FOREIGN PATENT DOCUMENTS

CN           87106947 A      5/1988
CN           1914351 A       2/2007
(Continued)

OTHER PUBLICATIONS

Machine Translation 01-279752 (Year: 1989).*
(Continued)

*Primary Examiner* — Rodney G McDonald
(74) *Attorney, Agent, or Firm* — ANOVA LAW GROUP, PLLC

(57) ABSTRACT

Embodiments of the present disclosure provide a semiconductor processing apparatus and a magnetron mechanism thereof. The magnetron mechanism is applied to the semiconductor processing apparatus and includes a backplane, an outer magnetic pole, and an inner magnetic pole. The outer magnetic pole is arranged on a bottom surface of the backplane and encloses to form accommodation space. The inner magnetic pole is arranged on the bottom surface of the backplane and located in the accommodation space. The
(Continued)

inner magnetic pole can move to change corrosion areas of the target material. The distance between the inner magnetic pole and the outer magnetic pole is always greater than a predetermined distance during the movement. With the semiconductor processing apparatus and the magnetron mechanism thereof of embodiments of the present disclosure can achieve the full target corrosion in a sputtering environment in a high-pressure state.

20 Claims, 4 Drawing Sheets

(58) Field of Classification Search
USPC .................................................. 204/298.2
See application file for complete search history.

(56) References Cited

U.S. PATENT DOCUMENTS

| | | | |
|---|---|---|---|
| 7,901,552 B2 * | 3/2011 | Pavloff | H01J 37/3423 204/298.12 |
| 2003/0136671 A1 | 7/2003 | Heinz et al. | |
| 2005/0211548 A1 | 9/2005 | Gung et al. | |
| 2017/0011894 A1 | 1/2017 | Yang et al. | |

FOREIGN PATENT DOCUMENTS

| | | | | |
|---|---|---|---|---|
| CN | 102064076 | A | | 5/2011 |
| CN | 102789941 | A | | 11/2012 |
| CN | 104109840 | A | | 10/2014 |
| CN | 204174268 | U | | 2/2015 |
| CN | 104810228 | A | | 7/2015 |
| CN | 204455275 | U | | 7/2015 |
| CN | 104937134 | A | | 9/2015 |
| CN | 111304620 | A | | 6/2020 |
| JP | 01279752 | A | * | 11/1989 |
| JP | H07118833 | A | | 5/1995 |
| JP | H08253859 | A | | 10/1996 |
| JP | H0987834 | A | | 3/1997 |
| JP | H11333719 | A | | 12/1999 |
| JP | 2009149927 | A | | 7/2009 |
| JP | 2016513336 | A | | 5/2016 |
| JP | 2016157820 | A | | 9/2016 |
| JP | 2018107388 | A | | 7/2018 |
| TW | I229138 | B | | 3/2005 |

OTHER PUBLICATIONS

The World Intellectual Property Organization (WIPO) International Search Report for PCT/CN2021/087780 Jul. 15, 2021 8 Pages (including translation).

* cited by examiner

SEMICONDUCTOR PROCESSING APPARATUS AND MAGNETRON MECHANISM

CROSS-REFERENCES TO RELATED APPLICATIONS

This application is a national phase entry under 35 U.S.C. § 371 of International Application No. PCT/CN2021/087780, filed on Apr. 16, 2021, which claims priority to Chinese Application No. 202010331542.2 filed on Apr. 24, 2020, the entire content of all of which are incorporated herein by reference.

TECHNICAL FIELD

The present disclosure generally relates to the semiconductor processing technology field and, more particularly, to a semiconductor processing apparatus and a magnetron mechanism.

BACKGROUND

In an integrated circuit manufacturing process, the physical vapor deposition (hereinafter referred to as PVD) technology is widely used to deposit related material layers such as different kinds of metal layers, hard masks, etc., due to its advantages of better film consistency, better uniformity, a wider process window, and realizing filling for a through-hole with a high depth-to-width ratio.

A conventional PVD apparatus generally uses direct current (DC) sputtering or radio frequency (RF) sputtering when preparing a TiN film. A sputtering pressure is in a low-pressure state (0.1 to 10 mTorr). In the sputtering environment, process particle contamination is poorly controlled. The prepared TiN film is mostly compressive stress and low density. However, in a 14 nm process, the process particle contamination needs to be more strictly controlled, and the TiN film is required to have high density and be tensile stress. In order to satisfy this requirement, the PVD apparatus needs to use RF+DC sputtering, and the sputtering pressure needs to be in a high-pressure state (generally 100 to 250 mTorr). Under this sputtering condition, the thickness uniformity of the TiN film prepared by the conventional PVD apparatus is poor, and the conventional PVD apparatus cannot achieve full target corrosion in the high-pressure state, which may cause the process particles to seriously exceed the standard and cannot meet the process requirements of the 14 nm process.

SUMMARY

For the disadvantages of the existing method, the present disclosure provides a semiconductor processing apparatus and a magnetron mechanism thereof, which can realize full target corrosion in a sputtering environment in a high-pressure state to effectively control the process particle contamination by improving the thickness uniformity of the thin film.

In an aspect, embodiments of the present disclosure provide a magnetron mechanism, applied to a semiconductor processing apparatus, including a backplane, an outer magnetic pole, and an inner magnetic pole, wherein:

the outer magnetic pole is arranged on a bottom surface of the backplane and encloses to form accommodation space, the inner magnetic pole is arranged on the bottom surface of the backplane and is located in the accommodating space, the inner magnetic pole moves to change a corrosion area of a target material, and a distance between the inner magnetic pole and the outer magnetic pole is always greater than a predetermined distance during movement.

In some embodiments, the inner magnetic pole moves linearly along a first direction parallel to the bottom surface of the backplane and alternately stops at a plurality of predetermined positions arranged at intervals along the first direction.

In some embodiments, the outer magnetic pole includes an outer arc portion and an inner arc portion, which are connected in series and together form the accommodation space. The outer arc portion is located on a side of the inner magnetic pole close to an edge of a surface of the target material. The inner arc portion is located on a side of the inner magnetic pole close to a center of the surface of the target material.

The predetermined positions include three positions, which are a first position, a second position, and a third position. The second position is located on a side of the first position close to the outer arc portion, and the third position is located on a side of the first position close to the inner arc portion.

In some embodiments, the magnetron mechanism further includes a drive device. The drive device is arranged on a top surface of the backplane, connected to the inner magnetic pole, and configured to drive the inner magnetic pole to move.

In some embodiments, the drive device includes a drive source and a connection member. The drive source is arranged on the top surface of the backplane and configured to provide power. One end of the connection member is connected to the drive source, and the other end of the connection member penetrates the backplane and is connected to the inner magnetic pole.

In some embodiments, the drive device further includes a guide rail. The guide rail is arranged on the top surface of the backplane, and the connection member is connected to the guide rail and moving along the guide rail.

In some embodiments, the predetermined distance is greater than or equal to 10 mm.

In some embodiments, the inner magnetic pole and the outer magnetic pole are arranged at an unequal interval, and the distance between the inner magnetic pole and the outer magnetic pole ranges from 30 to 60 mm.

In some embodiments, the inner magnetic pole is in a plane helix shape, one end of the inner magnetic pole is close to the center of the surface of the target material, and the other end of the inner magnetic pole is close to the edge of the surface of the target material.

In a second aspect, embodiments of the present disclosure provide a semiconductor processing apparatus, including a process chamber and the magnetron mechanism according to the first aspect. The magnetron mechanism is arranged on the top of the process chamber.

In some embodiments, the magnetron mechanism adopts the magnetron mechanism of embodiments of the present disclosure.

The semiconductor processing apparatus further includes an insulation chamber body and a hollow tube arranged above the process chamber. The insulation chamber body is filled with deionized water, the magnetron mechanism is arranged in the insulation chamber body, an isolation box is arranged on the backplane. The isolation box encloses the drive source and a connection part of the isolation box with the connection member to isolate the drive source and the connection part from the deionized water in the insulation chamber body.

One end of the hollow tube penetrates through the isolation box and is connected to the drive source. A first seal member is arranged between the hollow tube and a first through-hole passing through the isolation box and configured to seal a gap between the hollow tub and the first through-hole. The other end of the hollow tube penetrates the insulation chamber body and extends to outside of the insulation chamber body. A second seal member is arranged between the hollow tube and a second through-hole penetrating the insulation chamber body and configured to seal a gap between the hollow tube and the second through-hole. A wire of the drive source is arranged through the hollow tube to be guided to the outside of the insulation chamber body through the hollow tube.

In some embodiments, the semiconductor processing apparatus further includes an insulation chamber body arranged above the process chamber, deionized water is filled in the insulation chamber body, and the magnetron mechanism is arranged above the insulation chamber body.

The beneficial effects brought by the technical solutions of embodiments of the present disclosure are as follows.

In the magnetron mechanism of embodiments of the present disclosure, the outer magnetic pole forms the accommodation space on the bottom surface of the backplane, and the inner magnetic pole is located in the accommodation space and can move to change the corrosion areas of the target material. In a sputtering environment in a high-pressure state, by changing the corrosion area of the target material by moving the inner magnetic pole, a corresponding position of the target material that cannot be corroded during the whole sputtering process due to the inner magnetic pole being fixed at a certain position may be avoided to realize the full target corrosion. Thus, with the magnetron mechanism of embodiments of the present disclosure, the full target corrosion may be realized in the sputtering environment in the high-pressure state. Thus, the process particle contamination may be effectively controlled by improving the thickness uniformity of the thin film, which especially satisfies the process particle control requirements of the 14 nm process.

The semiconductor processing apparatus provided by embodiments of the present disclosure, by using the above-mentioned magnetron mechanism of embodiments of the present disclosure, can realize the full target corrosion in the sputtering environment of the high-pressure state. Thus, the process particle contamination may be effectively controlled by improving the thickness uniformity of the thin film, which especially satisfies the process particle control requirements of the 14 nm process.

Additional aspects and advantages of the present disclosure are partially described below, and will be apparent from the following description, or may be learned through practice of the present disclosure.

BRIEF DESCRIPTION OF THE DRAWINGS

The above and/or additional aspects and advantages of the present disclosure will become apparent and easy to understand from the following description of embodiments in connection with the accompanying drawings, wherein.

DETAILED DESCRIPTION OF THE EMBODIMENTS

Figure 1:
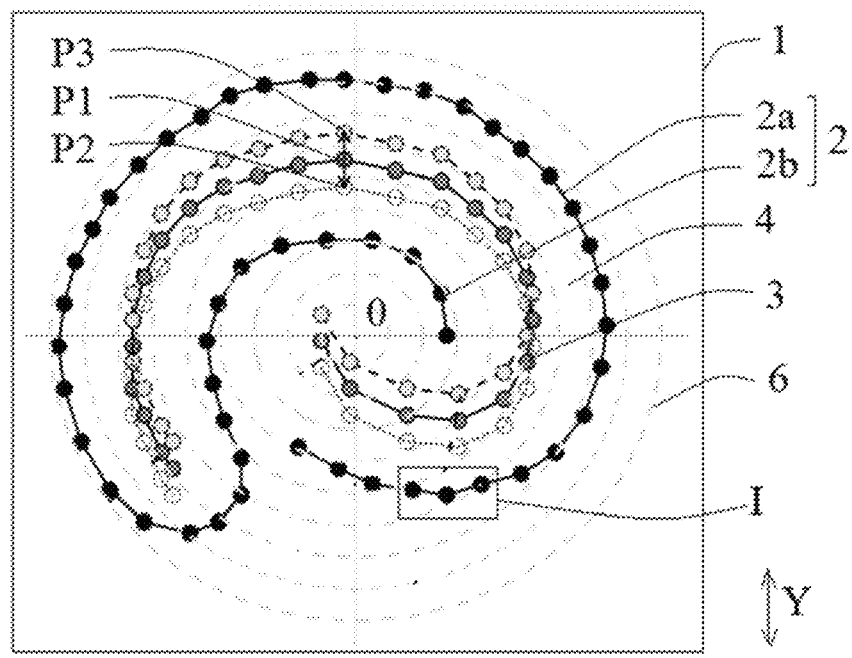
FIG. 1 is a schematic structural diagram of a magnetron mechanism according to some embodiments of the present disclosure.

The present disclosure is described in detail below, and examples of embodiments of the present disclosure are illustrated in the accompanying drawings. Same or similar reference numerals refer to same or similar parts or parts having same or similar functions. In addition, the detailed description of the known technology is omitted if the description is not necessary to illustrate the features of the present disclosure. Embodiments described below with reference to the accompanying drawings are exemplary and are only used to explain the present disclosure, but are not to be construed as a limitation of the present disclosure.

Those skilled in the art may understand that unless otherwise defined, all terms (including technical and scientific terms) used herein have the same meaning as commonly understood by one of ordinary skill in the art to which the present disclosure belongs. It should also be understood that terms, such as those defined in a general dictionary, should be understood to have meanings consistent with their meanings in the context of the prior art and, unless specifically defined as herein, should not be interpreted in idealistic or overly formal meaning.

The technical solutions of the present disclosure and how the technical solutions of the present disclosure solve the above-mentioned technical problems will be described in detail below with specific examples.

With reference to FIG. 1, embodiments of the present disclosure provide a magnetron mechanism, which is applied to a semiconductor processing apparatus. The magnetron mechanism includes a backplane 1, an outer magnetic pole 2, and an inner magnetic pole 3. A shape of the backplane 1 may be, for example, rectangular and made of metal material. In some embodiments, the backplane 1 can be connected to a rotation drive mechanism (not shown in the figure) of the semiconductor processing apparatus. Driven by the rotary drive mechanism, the backplane 1 can rotate around a vertical centerline of the backplane 1. The vertical centerline coincides, for example, with a center of a target surface (as indicated by point O in FIG. 1). It should be noted that, in practical applications, the material and shape of the backplane 1 and the connection position with the rotation drive mechanism can be designed according to the actual situation, which is not particularly limited in embodiments of the present disclosure.

Figure 2:
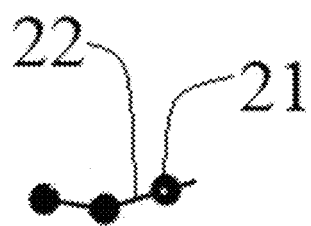
FIG. 2 is a schematic enlarged view of region I in FIG. 1.

The outer magnetic pole 2 is arranged on a bottom surface of the backplane 1 and encloses to form accommodation space 4. The outer magnetic pole 2 may have various specific structures. For example, as shown in FIG. 2, the outer magnetic pole 2 is composed of a plurality of outer magnets 21 and a plurality of outer magnetic conductive strips 22 that connect the plurality of outer magnets 21 in series to form a continuous line shape arrangement on the bottom surface of the backplane 1 and enclose to form the above-mentioned accommodation space 4. An outer magnetic conductive strip 22, for example, may be made of stainless steel. A plurality of mounting holes configured to fix the outer magnets 21 are arranged on the outer magnetic conductive strip 22.

The outer magnetic pole 2 may have a plurality of specific arrangement shapes. For example, as shown in FIG. 1, the outer magnetic pole 2 includes an outer arc portion 2a and an inner arc portion 2b, which are connected in series and together form an accommodation space 4. The outer arc portion 2a may be located on a side of the inner magnetic pole 3 close to an edge of the target surface. The inner arc portion 2b may be located on a side of the inner magnetic pole 3 close to the center of the target surface. In some embodiments, the outer arc portion 2a and the inner arc portion 2b may be both in a plane spiral shape. The outer arc portion 2a and the inner arc portion 2b may be connected end to end. The connection may be smoothed. Between two ends of the outer arc portion 2a and the inner arc portion 2b that are not connected, an opening may be provided. It should be noted that, in practical applications, according to actual process requirements, the specific arrangement shape of the outer magnetic pole 2 can be freely set, as long as the accommodation space 4 can be enclosed to accommodate the inner magnetic poles 3.

The inner magnetic pole 3 may be arranged on the bottom surface of the backplane 1 and located in the above-mentioned accommodation space 4. The inner magnetic pole 3 may have a plurality of specific structures. For example, the same as the outer magnetic pole 2, the inner magnetic pole 3 may be composed of a plurality of inner magnets and a plurality of inner magnetic conductive stripes configured to connect the plurality of magnets in series. Thus, a continuous line shape arrangement may be formed on the bottom surface of the backplane 1. The inner magnetic conductive strip, for example, may be made of stainless steel. A plurality of mounting holes configured to fix the inner magnets may be arranged on the inner magnetic conductive strip. The inner magnetic pole 3 may have various specific arrangement shapes. For example, as shown in FIG. 1, the inner magnetic pole 3 is in a plane spiral shape, and one end of the inner magnetic pole 3 is close to the center of the surface of the target material, and the other end of the inner magnetic pole 3 is close to the edge of the surface of the target material. That is, two ends of the inner magnetic pole 3 are disconnected, and an opening is provided therebetween. With such an arrangement, the realization of the full target corrosion may be facilitated.

Furthermore, the inner magnetic pole 3 can move relative to the backplane 1 and the outer magnetic pole 2 to change a corrosion area of the target. Moreover, a distance between the inner magnetic pole 3 and the outer magnetic pole 2 may be always greater than a predetermined distance during the movement. That is, when the inner magnetic pole 3 moves in the accommodation space 4, a certain distance must be maintained between the inner magnetic pole 3 and the outer magnetic pole 2. The above-mentioned predetermined distance satisfies that the inner magnetic pole 3 is prevented from colliding with the outer magnetic pole 2, and ignition discontinuity of the process chamber of the semiconductor processing apparatus may be avoided because the inner magnetic pole 3 is too close to the outer magnetic pole 2. Thus, the lowering of the process uniformity caused by the ignition discontinuity may be avoided to effectively improve the uniformity of the process result.

In some embodiments, the predetermined distance may be greater than or equal to 10 mm. Within this distance range, the collision between the inner magnetic pole 3 and the outer magnetic pole 2 can be avoided when the inner magnetic pole 3 moves, and the ignition discontinuity of the process chamber of the semiconductor apparatus caused by the inner magnetic pole 3 being too close to the outer magnetic pole 2 may be effectively avoided.

In some embodiments, the inner magnetic pole 3 and the outer magnetic pole 2 may be arranged at unequal intervals. In addition, the distance between the inner magnetic pole 3 and the outer magnetic pole 2 may range from 30 to 60 mm. For example, within the above distance range, a specific spacing value may include a combination of 35 mm, 40 mm, 42 mm, 48 mm, 53 mm, 55 mm, 58 mm, and 60 mm. However, embodiments of the present disclosure are not limited to this, as long as full target corrosion can be achieved. It should be noted that, in practical applications, the inner magnetic pole 3 and the outer magnetic pole 2 may also be arranged at equal intervals to be suitable for another process environment. Therefore, embodiments of the present disclosure are not limited to this, and those skilled in the art can adjust the settings by themselves according to different work conditions.

It should be noted that, in practical applications, by satisfying the above condition, the specific arrangement shape of the inner magnetic pole 3 can be freely set according to actual process requirements.

In the sputtering environment (RF+DC sputtering) with a high-pressure state (generally 100 to 250 mTorr), although the thickness uniformity of the film can be improved, serious reverse sputtering may occur at a corresponding position directly under the position where the inner magnetic pole 3 is located on the surface of the target. The reverse sputtering may cause the corresponding position to be unable to be corroded. Thus, particles in an area of the target that is more corroded may be deposited in the area that cannot be corroded to cause the process particles to seriously exceed the standard. In order to solve the above problems, the corrosion area of the target may be changed by moving the inner magnetic pole 3, which can avoid that the corresponding position of the target cannot be corroded during the whole sputtering process because the inner magnetic pole 3 is fixed at a certain position. Thus, the full target corrosion can be achieved. Therefore, the magnetron mechanism of embodiments of the present disclosure can realize the full target corrosion in a high-pressure sputtering environment. Thus, the process particle contamination may be effectively controlled by improving the thickness uniformity of the film, which especially satisfies the process particle control requirements of the 14 nm process.

In an embodiment of the present disclosure, as shown in FIG. 1, the inner magnetic pole 3 moves linearly along a first direction (Y direction shown in FIG. 1) parallel to the bottom surface of the backplane 1, and alternately stay at a plurality of predetermined positions arranged at intervals along the first direction. By making the inner magnetic pole 3 move linearly, the movement mode of the inner magnetic pole 3 may be simplified and easy to realize, and maintaining a certain distance between the inner magnetic pole 3 and the outer magnetic pole 2 as a whole may be beneficial to realize. Thus, the inner magnetic pole 3 may be prevented from colliding with the outer magnetic pole 2 during the movement, and the ignition discontinuity of the process chamber of the semiconductor apparatus may be effectively avoided due to the inner magnetic pole 3 being too close to the outer magnetic pole 2.

In an embodiment of the present disclosure, as shown in FIG. 1, on the basis that the outer magnetic pole 2 adopts the shape shown in FIG. 1, three above-mentioned predetermined positions are provided, which include a first position P1, a second position P2, and a third position P3. The three positions are arranged at intervals along the above-mentioned first direction. Second position P2 is located on a side of first position P1 close to the outer arc portion 2a. Third position P3 is located on a side of first position P1 close to the inner arc portion 2b. The inner magnetic pole 3 can be switched between the above-mentioned three predetermined positions along the first direction (i.e., the Y direction in FIG. 1). When the inner magnetic pole 3 is located at first position P1, the inner magnetic pole 3 may be located at a position close to a middle position between the outer arc portion 2a and the inner arc portion 2b. When the inner magnetic pole 3 is located at second position P2, the inner magnetic pole 3 may be located at a position close to the inner arc portion 2b. When the inner magnetic pole 3 is located at third position P3, the inner magnetic pole 3 may be located at a position close to the outer arc portion 2a. Thus, at different positions, the inner magnetic pole 3 may correspond to different areas that cannot be corroded on the surface of the target. By switching the inner magnetic pole 3 between the above three predetermined positions, the area that cannot be corroded corresponding to each predetermined position may be corroded when the inner magnetic pole 3 moves to another predetermined position to realize the full target corrosion.

To facilitate the description of embodiments of the present disclosure, a description is made in connection with a specific embodiment of the present disclosure. A dotted line area 6 shown in FIG. 1 represents an area covered by the magnetron mechanism of embodiments of the present disclosure during rotation, that is, the target corrosion area. With reference to FIG. 1 and the following table 1, when the inner magnetic pole 3 is located at first position P1, three non-corroded areas on the surface of the target are provided correspondingly. Radius ranges of the three areas are R1 (35 to 50 mm), R2 (102 to 110 mm), and R3 (140 to 150 mm). When the inner magnetic pole 3 is located at second position P2, two non-corroded areas on the surface of the target are provided correspondingly, and radius ranges of the two areas are R2 (90 to 100 mm) and R3 (145 to 160 mm). When the inner magnetic pole 3 is located at third position P3, two non-corroded areas on the surface of the target are provided correspondingly, and the radius ranges of the two areas are R1 (30 to 50 mm) and R2 (105 to 125 mm).

TABLE 1

Correspondence table between the position of the inner magnetic pole and the non-corroded area on the surface of the target.

| Position of Inner Magnetic Pole | Non-corroded Area | | |
| --- | --- | --- | --- |
| | R1(mm) | R2(mm) | R3(mm) |
| First position P1 | 35~50 | 102~110 | 140~150 |
| Second position P2 | — | 90~100 | 145~160 |
| Third position P3 | 30~50 | 105~125 | — |

It can be seen from the above that when the inner magnetic pole 3 is located at second position P2, the non-corroded areas with radius ranges R1 and R2 corresponding to first position P1 and third position P3 can be corroded. When the inner magnetic pole 3 is located at third position P3, the non-etched area corresponding to second position P2 with a radius range R3 may be corroded. Therefore, by switching the inner magnetic pole 3 between the above-mentioned three predetermined positions, the areas corresponding to each predetermined position that cannot be corroded can be corroded when the inner magnetic pole 3 is moved to another predetermined position to realize the full target corrosion.

Figure 4:
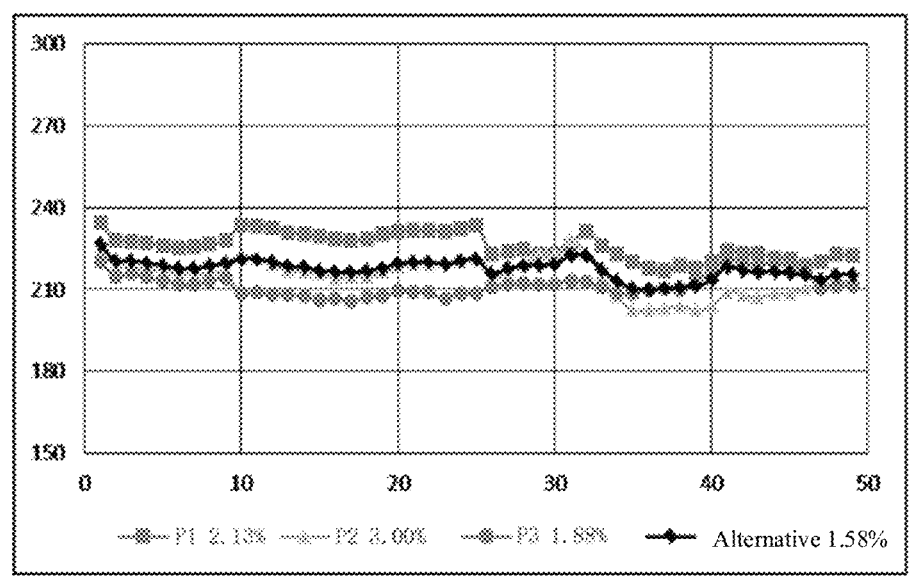
FIG. 4 is a schematic diagram showing process result comparison with an internal magnetic pole at different positions according to embodiments of the present disclosure.

FIG. 4 is a schematic diagram showing process result comparison with an internal magnetic pole at different positions according to embodiments of the present disclosure. As shown in FIG. 4, thickness uniformities of the films obtained by performing the process by fixing the inner magnetic pole 3 fixed at the above three predetermined positions are 2.1%, 3.00%, and 1.88%, respectively. All three are within 3.00%. Based on this, in the process of performing the process, by switching the inner magnetic pole 3 between the above three predetermined positions, the thickness uniformity of the film can be increased to 1.58%, which is obviously better than 3% to further improve the thickness uniformity of the film.

It should be noted that embodiments of the present disclosure do not limit the above-mentioned first direction and a specific number of the above-mentioned predetermined positions. For example, the above-mentioned first direction is not limited to Y direction in FIG. 1 and can be a direction having any included angle with Y direction. In practical applications, the first direction and the specific numbers of the predetermined positions can be adjusted and set according to the arrangement of the outer magnetic pole 2 and the inner magnetic pole 3 and the distance between the outer magnetic pole 2 and the inner magnetic pole 3. Therefore, embodiments of the present disclosure are not limited to this, and those skilled in the art can adjust the settings according to the actual situation.

Figure 3:
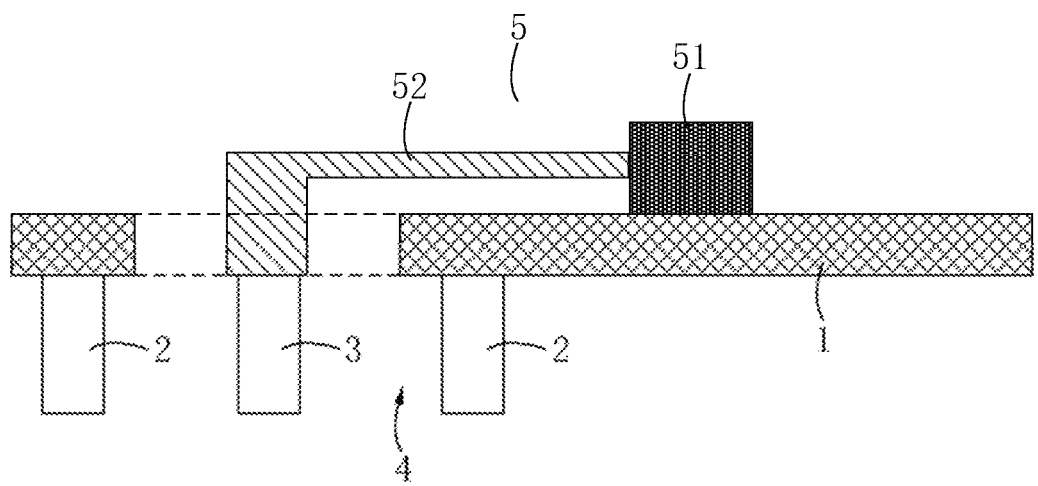
FIG. 3 is a schematic cross-section view of a drive device according to embodiments of the present disclosure.

In an embodiment of the present disclosure, as shown in FIG. 3, the magnetron mechanism further includes a drive device 5. The drive device 5 is located on one side of a top surface of the backplane 1, connected to the inner magnetic pole 3, and configured to drive the inner magnetic pole 3 to move. With the drive device 5, automatic control of the movement of the inner magnetic pole 3 can be realized during performing the process. Of course, in practical applications, embodiments of the present disclosure are not limited to this, the inner magnetic pole 3 can also be driven to move in a manual control manner.

In an embodiment of the present disclosure, the drive device 5 may include a drive source 51 and a connection member 52. The drive source 51 is arranged on the top surface of the backplane 1 and configured to provide power. One end of the connection member 52 may be connected to the drive source 51. The other end of the connection member 52 penetrates the backplane 1 and is connected to the inner magnetic pole 3. In some embodiments, the drive device 5 may further include a guide rail (not shown in the figure). The guide rail may be arranged on the top surface of the backplane 1. The connection member 52 may be connected to the guide rail and can move along the guide rail. With the aid of the above-mentioned guide rail, the movement of the connection member 52 can be guided to ensure the movement accuracy of the inner magnetic pole 3. It should be noted that the backplane 1 may have a hollow structure at the position where the connection member 52 passes through. The size of the hollow structure may be adapted to a movement range of the connection member 52 to ensure that the movement of the connector 52 does not interfere.

In an embodiment of the present disclosure, the drive source 51 may be a stepping motor, which is configured to control a displacement of the connection member 52 through a signal to further improve the movement accuracy of the inner magnetic pole 3. Of course, in practical applications, the drive source 51 may also be a servo motor or a lead screw motor. By using different types of drive sources, an application scope of embodiments of the present disclosure may be effectively expanded to effectively reduce application and maintenance costs.

In summary, in the magnetron mechanism of embodiments of the present disclosure, the outer magnetic pole may form an accommodation space on the bottom surface of the backplane, and the inner magnetic pole may be located in the accommodation space and move to change the corroded area of the target material. In a high-pressure sputtering environment, the corroded area of the target material may be changed by moving the inner magnetic pole, which can avoid that the corresponding position of the target material cannot be corroded during the whole sputtering process when the inner magnetic pole is fixed at a certain position. Thus, the full target corrosion can be realized. Therefore, the magnetron mechanism of embodiments of the present disclosure can realize the full target corrosion in the sputtering environment in the high-pressure state. Thus, the process particle contamination may be effectively controlled by improving the thickness uniformity of the film, which especially satisfies the process particle control requirements of the 14 nm process.

Figure 5:
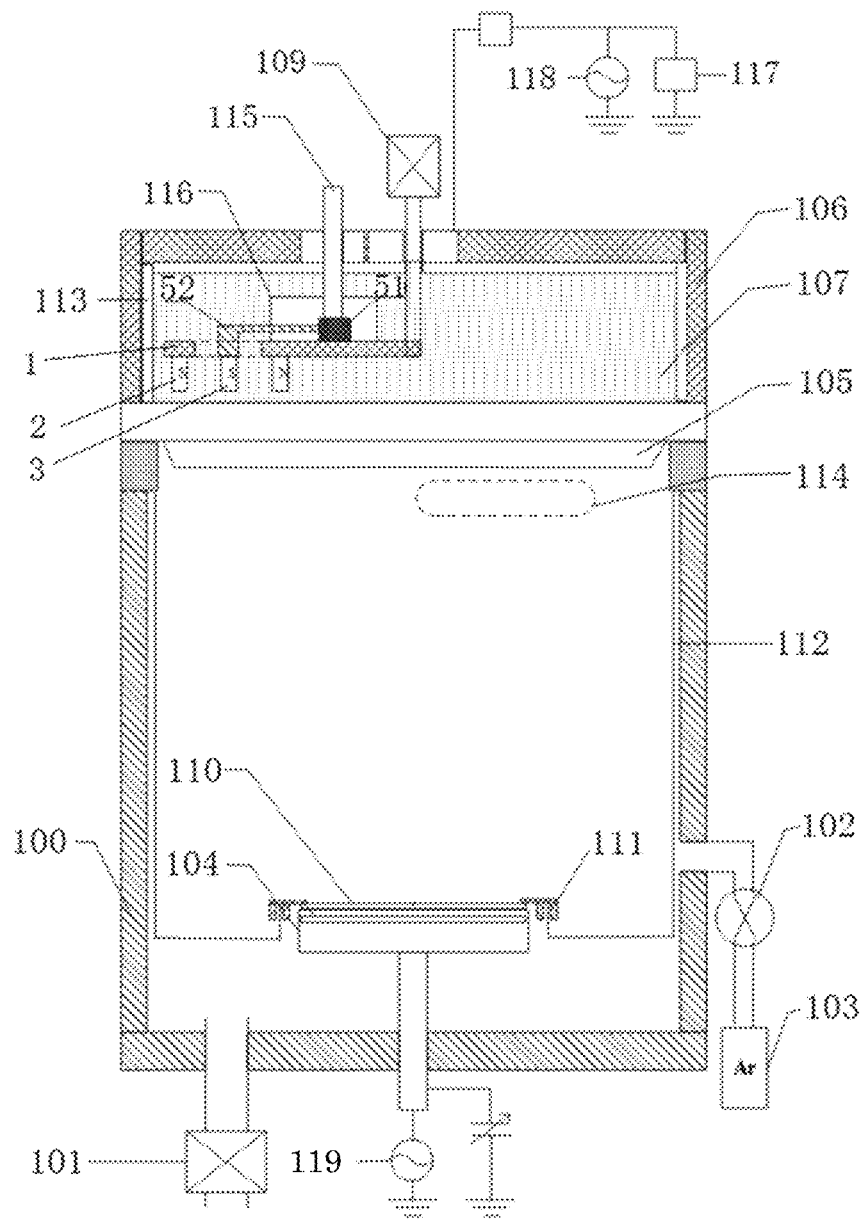
FIG. 5 is a schematic structural diagram of a semiconductor processing apparatus according to embodiments of the present disclosure.

Based on the same inventive concept, embodiments of the present disclosure provide a semiconductor processing apparatus, including a process chamber. For example, with reference to FIG. 5, the process chamber includes a chamber body 100. A vacuum pump system 101 is connected to the bottom of the chamber body 100, which is configured to evacuate the chamber body 100 to reach a determined degree of vacuum (e.g., 10 to 6 Torr) in the chamber body. In addition, a gas inlet pipeline is connected to one side of the chamber body 100. Angas inlet end of the gas inlet pipeline is connected to a gas source 103 and configured to transmit the reaction gas (such as argon, nitrogen, etc.) to the inside of the reaction chamber 1. In addition, a flow meter 102 is arranged at the gas inlet pipeline and configured to control a gas inlet amount of the reaction gas.

Moreover, a base 104 may be arranged inside the chamber body 100 and configured to carry a wafer 110. The base 104 may have heating and/or cooling functions. The base 104 may be electrically connected to a bias power supply 119 to apply a bias power to the base 104 to change the particle energy and plasma sheath thickness on the surface of the substrate. Thus, the stress and density of the film may be improved. In addition, an inner liner 112 may be arranged around an inner side of a sidewall of the chamber body 100. When the base 104 is located below the process position, the bottom of the inner liner 112 may carry a pressure ring 111. The pressure ring 111 may be configured to press an edge area of the wafer 110 when the base 104 is located at the process position.

The target material 105 may be arranged inside the chamber body 100 and located above the base 104. The target material 105 may be prepared by using a metal material or a metal compound material. In addition, an insulating chamber body 106 may be arranged above the chamber body 100, The insulation chamber body 106 may be filled with deionized water 107. In addition, an annular current expansion electrode 113 may be arranged on an inner side of the sidewall of the insulation chamber body 106. The annular current expansion electrode 113 may be electrically connected to the target material 105, and electrodes of the upper RF power supply 118 and the DC power supply 117 and configured to apply RF power and DC power to the target material to obtain a co-sputtering environment of RF and DC. A plasma 114 may be formed inside the chamber body 100.

In addition, the magnetron mechanism may be arranged above the target material 105 and located in the insulation chamber body 106. The magnetron mechanism may adopt the magnetron mechanism of the above-mentioned embodiments. For example, in the present embodiment, the magnetron mechanism may be arranged on the top of the chamber body 100 of the process chamber and located in the above-mentioned insulation chamber body 106. With the aid of the magnetron mechanism 108, the sputtering deposition rate can be effectively increased.

Taking the magnetron mechanism shown in FIG. 3 as an example, the magnetron mechanism includes a backplane 1, an outer magnetic pole 2, an inner magnetic pole 3, a drive source 51, and a connection member 52. An isolation box 116 is arranged on the backplane 1. The isolation box 116 encloses the drive source 51 and the connection part of the drive source 51 with the connection member 52 to isolate the drive source 51 and the connection part of the drive source 51 with the connection member 52 from the deionized water 107 in the insulation chamber body 106. Moreover, a wire of the drive source 51 may be led out of the insulation chamber body 106 through a hollow tube 115 to be connected to a power source. Specifically, one end of the hollow tube 115 passes through the isolation box 116 and is connected to the drive source 51. A first seal member is arranged between the hollow tube 115 and the first through-hole passing through the isolation box 116 and configured to seal a gap between the hollow tube 115 and the first through-hole. The other end of the hollow tube 115 passes through the insulation chamber body 106 and extends to the outside of the insulation chamber body 106. A second seal member is arranged between the hollow tube 115 and the second through-hole passing through the insulation chamber body 106 and configured to seal a gap between the hollow tube 115 and the second through-hole. The wire of the drive source 51 is arranged through the hollow tube 115 and is led to the outside of the insulation chamber body 106 through the hollow tube 115.

In addition, the backplane 1 may be connected to the rotation drive source 109. Specifically, the drive shaft of the rotation drive source 109 may penetrate the insulation chamber body 106, extend to the inside of the insulation chamber body 106, be connected to the backplane 1 of the magnetron mechanism, and be configured to drive the inner and outer magnetic poles on the backplane 1 to rotate synchronously by driving the backplane 1. In some embodiments, a magnetic fluid bearing can be configured to seal the gap between the drive shaft of the rotation drive source 109 and the through-hole penetrating the insulation chamber body 106 to ensure that the drive shaft of the rotation drive source 109 can rotate, and the inside of the insulation chamber body 106 can be sealed. By using the rotation drive source 109 to drive the magnetron mechanism to rotate, a time-homogenized magnetic field can be generated at various angles in the circumferential direction of the chamber body 100 to achieve a more uniform sputtering shape of the target material to improve the uniformity of film deposition.

Figure 6:
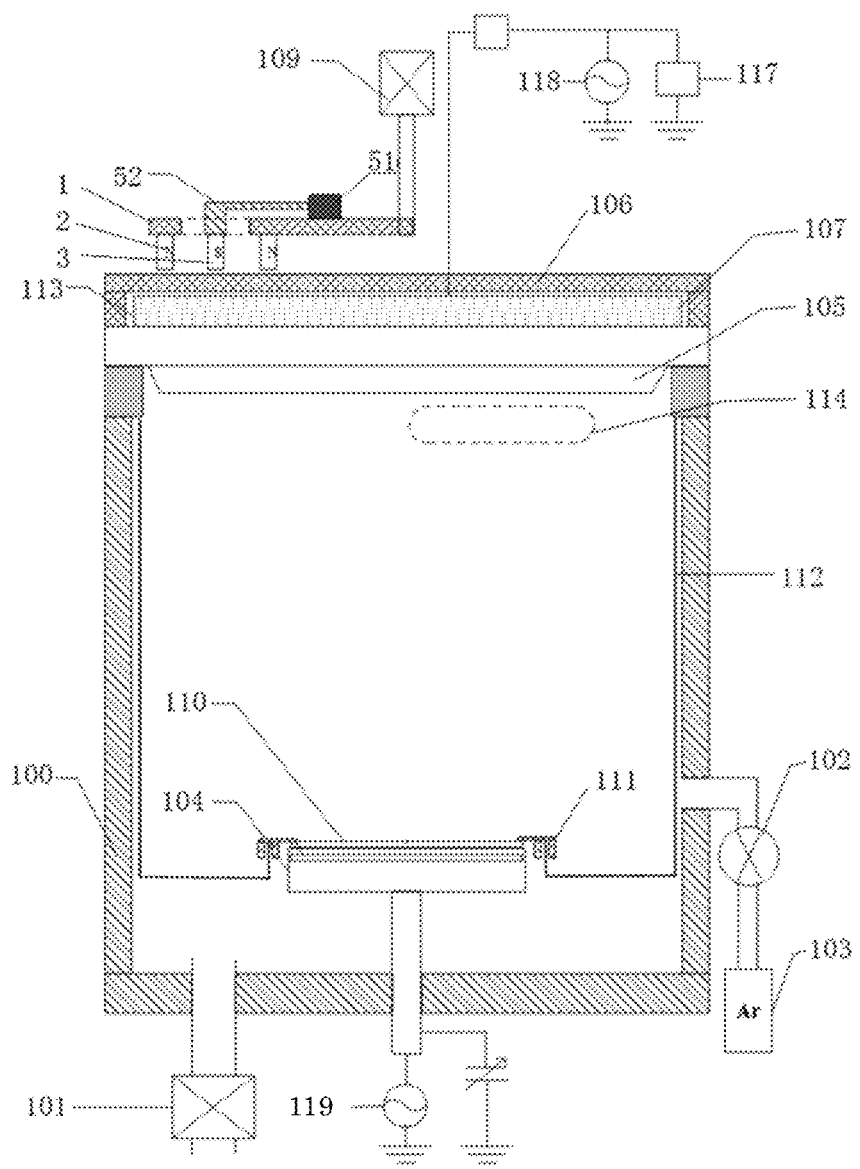
FIG. 6 is a schematic structural diagram of another semiconductor processing apparatus according to embodiments of the present disclosure.

It should be noted that, in this embodiment, the above-mentioned magnetron mechanism may be arranged in the insulation chamber body 106. However, embodiments of the present disclosure are not limited to this. For example, as shown in FIG. 6, the magnetron mechanism is further arranged outside the insulation chamber body 106 and located above the insulation chamber body 106. In this situation, the wire of the drive source 51 can be connected to the power supply in a conventional manner. Other structures of the semiconductor processing apparatus shown in FIG. 6 are the same as those of the semiconductor processing apparatus shown in FIG. 5.

It should be noted that, in practical applications, for the above-mentioned magnetron mechanism, the setting position and the setting manner of the magnetron mechanism can be adaptively adjusted according to the semiconductor processing apparatuses of different structures, which is not particularly limited in embodiments of the present disclosure.

With the semiconductor processing apparatus of embodiments of the present disclosure, by using the above-mentioned magnetron mechanism of embodiments of the present disclosure, the full target corrosion may be realized in the sputtering environment in the high-pressure state. Thus, the thickness uniformity of the thin film may be improved, and the process particle contamination may be effectively controlled, which can especially satisfy the process particle control requirements of the 14 nm process.

It can be understood that the above embodiments are only exemplary embodiments adopted to illustrate the principle of the present disclosure, but the present disclosure is not limited to this. For those of ordinary skill in the art, without departing from the spirit and essence of the present disclosure, various modifications and improvements can be made, and these modifications and improvements are also within the protection scope of the present disclosure.

In the description of the present disclosure, it should be understood that the orientation or positional relationship indicated by the terms "center," "upper," "lower," "front," "rear," "left," "right," "vertical," "horizontal," "top," "bottom," "inner," "outer," etc., are based on the orientation or positional relationship shown in the drawings and are only to facilitate describing the present disclosure and simplifying the description, rather than indicating or implying that the referred device or element must have a particular orientation and be constructed and operated in a particular orientation, which should not be construed as a limitation of the present disclosure.

The terms "first" and "second" are only used for descriptive purposes, and should not be construed as indicating or implying relative importance or implicitly indicating the number of indicated technical features. Thus, a feature defined as "first" or "second" may expressly or implicitly include one or more of the features. In the description of the present disclosure, unless otherwise specified, "a plurality of" means two or more.

In the description of the present disclosure, it should be noted that the terms "installed," "connected," and "coupled" should be understood in a broad sense, unless otherwise expressly specified and limited, for example, which includes a fixed connection or a detachable connection, or integral connection, and also includes a direct connection, or an indirect connection through an intermediate medium, and the internal communication of two elements. For those of ordinary skill in the art, the specific meanings of the above terms in the present disclosure can be understood in specific situations.

In the description of the present specification, the particular features, structures, materials, or characteristics may be combined in any suitable manner in any one or more embodiments or examples.

The above are only some embodiments of the present disclosure. It should be pointed out that for those of ordinary skill in the art, without departing from the principles of the present disclosure, several improvements and modifications can also be made. These improvements and modifications should be within the protection scope of the present disclosure.

What is claimed is:

1. A magnetron mechanism, applied to a semiconductor processing apparatus, comprising:
   a backplane;
   an outer magnetic pole arranged on a bottom surface of the backplane and enclosing to form accommodation space and comprising an outer arc portion and an inner arc portion in a plane spiral shape, the outer arc portion and the inner arc portion being connected in series, with an opening between two ends of the outer arc portion and the inner arc portion that are not connected; and
   an inner magnetic pole arranged on the bottom surface of the backplane and located in the accommodating space, the inner magnetic pole moving to change a corrosion area of a target material, and a distance between the inner magnetic pole and the outer magnetic pole being always greater than a predetermined distance during movement.

2. The magnetron mechanism according to claim 1, wherein the inner magnetic pole moves linearly along a first direction parallel to the bottom surface of the backplane and alternately stops at a plurality of predetermined positions arranged at intervals along the first direction.

3. The magnetron mechanism according to claim 2, wherein:
   the outer arc portion is located on a side of the inner magnetic pole at an edge of a surface of the target material; and
   the inner arc portion is located on a side of the inner magnetic pole at a center of the surface of the target material, the outer arc portion and the inner arc portion together form the accommodation space;
   the predetermined positions include a first position, a second position, and a third position, the second position being located on a side of the first position close to the outer arc portion, and the third position being located on a side of the first position close to the inner arc portion.

4. The magnetron mechanism according to claim 1, wherein the magnetron mechanism further includes a drive device, the drive device being arranged on a top surface of the backplane, connected to the inner magnetic pole, and configured to drive the inner magnetic pole to move.

5. The magnetron mechanism according to claim 4, wherein the drive device includes:
   a drive source arranged on the top surface of the backplane and configured to provide power; and
   a connection member, one end of the connection member being connected to the drive source, and the other end of the connection member penetrating the backplane and being connected to the inner magnetic pole.

6. The magnetron mechanism according to claim 5, wherein the drive device further includes:
   a guide rail arranged on the top surface of the backplane, and the connection member being connected to the guide rail and moving along the guide rail.

7. The magnetron mechanism according to claim 1, wherein the predetermined distance is greater than or equal to 10 mm.

8. The magnetron mechanism according to claim 1, wherein:
the inner magnetic pole and the outer magnetic pole are arranged at an unequal interval; and
the distance between the inner magnetic pole and the outer magnetic pole ranges from 30 to 60 mm.

9. The magnetron mechanism according to claim 1, wherein:
the inner magnetic pole is in a plane helix shape;
one end of the inner magnetic pole is close to the center of the surface of the target material; and
the other end of the inner magnetic pole is close to the edge of the surface of the target material.

10. The semiconductor processing apparatus according to claim 1, wherein:
the inner magnetic pole and the outer magnetic pole are arranged at an unequal interval; and
the distance between the inner magnetic pole and the outer magnetic pole ranges from 30 to 60 mm.

11. The semiconductor processing apparatus according to claim 1, wherein:
the inner magnetic pole is in a plane helix shape;
one end of the inner magnetic pole is close to the center of the surface of the target material; and
the other end of the inner magnetic pole is close to the edge of the surface of the target material.

12. A semiconductor processing apparatus comprising:
a process chamber; and
a magnetron mechanism arranged on the top of the process chamber and including:
a backplane;
an outer magnetic pole arranged on a bottom surface of the backplane and enclosing to form accommodation space and comprising an outer arc portion and an inner arc portion in a plane spiral shape, the outer arc portion and the inner arc portion being connected in series, with an opening between two ends of the outer arc portion and the inner arc portion that are not connected; and
an inner magnetic pole arranged on the bottom surface of the backplane and located in the accommodating space, the inner magnetic pole moving to change a corrosion area of a target material, and a distance between the inner magnetic pole and the outer magnetic pole being always greater than a predetermined distance during movement.

13. The semiconductor processing apparatus according to claim 12, further comprising:
an insulation chamber body filled with deionized water, the magnetron mechanism being arranged in the insulation chamber body, an isolation box being arranged on the backplane, and the isolation box enclosing a drive source and a connection part of the isolation box with the connection member to isolate the drive source and the connection part from the deionized water in the insulation chamber body; and
a hollow tube arranged above the process chamber, one end of the hollow tube penetrating through the isolation box and being connected to the drive source, and a first seal member being arranged between the hollow tube and a first through-hole passing through the isolation box and configured to seal a gap between the hollow tube and the first through-hole, the other end of the hollow tube penetrating the insulation chamber body and extends to outside of the insulation chamber body, a second seal member being arranged between the hollow tube and a second through-hole penetrating the insulation chamber body and configured to seal a gap between the hollow tube and the second through-hole, and a wire of the drive source being arranged through the hollow tube to be guided to the outside of the insulation chamber body through the hollow tube.

14. The semiconductor processing apparatus according to claim 12, further comprising:
an insulation chamber body arranged above the process chamber and filled with deionized water, the magnetron mechanism being arranged above the insulation chamber body.

15. The semiconductor processing apparatus according to claim 12, wherein the inner magnetic pole moves linearly along a first direction parallel to the bottom surface of the backplane and alternately stops at a plurality of predetermined positions arranged at intervals along the first direction.

16. The semiconductor processing apparatus according to claim 15, wherein:
the outer arc portion is located on a side of the inner magnetic pole at an edge of a surface of the target material; and
the inner arc portion is located on a side of the inner magnetic pole at a center of the surface of the target material, the outer arc portion and the inner arc portion together form the accommodation space;
the predetermined positions include a first position, a second position, and a third position, the second position being located on a side of the first position close to the outer arc portion, and the third position being located on a side of the first position close to the inner arc portion.

17. The semiconductor processing apparatus according to claim 12, wherein the magnetron mechanism further includes a drive device, the drive device being arranged on a top surface of the backplane, connected to the inner magnetic pole, and configured to drive the inner magnetic pole to move.

18. The semiconductor processing apparatus according to claim 17, wherein the drive device includes:
a drive source arranged on the top surface of the backplane and configured to provide power; and
a connection member, one end of the connection member being connected to the drive source, and the other end of the connection member penetrating the backplane and being connected to the inner magnetic pole.

19. The semiconductor processing apparatus according to claim 18, wherein the drive device further includes:
a guide rail arranged on the top surface of the backplane, and the connection member being connected to the guide rail and moving along the guide rail.

20. The semiconductor processing apparatus according to claim 12, wherein the predetermined distance is greater than or equal to 10 mm.

* * * * *